US006887740B2

United States Patent
Tandy et al.

(10) Patent No.: US 6,887,740 B2
(45) Date of Patent: May 3, 2005

(54) METHOD FOR MAKING AN INTEGRATED CIRCUIT PACKAGE HAVING REDUCED BOW

(75) Inventors: William D. Tandy, Boise, ID (US); Matt E. Schwab, Boise, ID (US); Cary J. Baerlocher, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/412,064

(22) Filed: Apr. 10, 2003

(65) Prior Publication Data

US 2003/0201547 A1 Oct. 30, 2003

Related U.S. Application Data

(62) Division of application No. 09/648,316, filed on Aug. 25, 2000, now Pat. No. 6,577,018.

(51) Int. Cl.[7] .................. H01L 21/44; H01L 21/48; H01L 21/50
(52) U.S. Cl. ........................ 438/124; 438/106
(58) Field of Search ............... 438/106, 121, 438/123, 124, 125, 126, 127

(56) References Cited

U.S. PATENT DOCUMENTS

| | | | | |
|---|---|---|---|---|
| 5,150,194 A | | 9/1992 | Brooks et al. ............ 357/70 |
| 5,214,307 A | | 5/1993 | Davis ....................... 257/676 |
| 5,733,800 A | * | 3/1998 | Moden ...................... 438/118 |
| 5,864,175 A | | 1/1999 | Burns ....................... 257/684 |
| 5,889,318 A | | 3/1999 | Corisis ...................... 257/670 |
| 6,002,165 A | | 12/1999 | Kinsman ................... 257/666 |
| 6,111,307 A | | 8/2000 | Corisis ...................... 257/666 |
| 6,147,374 A | * | 11/2000 | Tanaka et al. ............ 257/295 |
| 6,274,938 B1 | * | 8/2001 | Ohuchi et al. ............ 257/795 |
| 6,326,681 B1 | | 12/2001 | Murakami et al. ........ 257/676 |
| 6,384,487 B1 | * | 5/2002 | Smith ....................... 257/790 |
| 6,396,131 B1 | * | 5/2002 | Kinsman et al. ......... 257/669 |

* cited by examiner

Primary Examiner—Eddie Lee
Assistant Examiner—Douglas W. Owens
(74) Attorney, Agent, or Firm—Schwegman, Lundberg, Woessner & Kluth, P.A.

(57) ABSTRACT

An integrated circuit device includes a semiconductor component coupled with a lead frame, and an integrated circuit package encompassing at least a portion of the semiconductor component. The package has a first surface and a second surface, and side surfaces, where the first surface is opposite the second surface. A parting line of the integrated circuit package is offset toward the second surface of the package, where the first surface optionally comprises the bottom surface of the package. The first surface of the package has one or more recessed areas.

21 Claims, 5 Drawing Sheets

METHOD FOR MAKING AN INTEGRATED CIRCUIT PACKAGE HAVING REDUCED BOW

RELATED APPLICATION

This application is a Divisional of U.S. application Ser. No. 09/648,316 filed on Aug. 25, 2000 now U.S. Pat. No. 6,577,018 which is incorporated herein by reference.

FIELD OF THE INVENTION

The present invention relates generally to semiconductor mounting packages. More particularly, it pertains to reducing bow for a semiconductor mounting package.

BACKGROUND OF THE INVENTION

Integrated circuits include packaging which houses sensitive semiconductor components. The semiconductor components, and their packaging, are being produced with diminishing geometries such that an electronic circuit board with increased density can be produced. As the packaging is produced, often the parting line formed during the overmolding process is offset from the center of the packaging, resulting in an imbalance of the molding compound on either side of the parting line. As the molding compound is cured, the imbalance of compound causes the package to bow. As the geometries diminish, the imbalance of compound becomes greater, resulting in increasing bowing effect. One solution to reduce the amount of bowing is to reduce the entire thickness of the entire packaging. However, this was not effective in reducing bow and results in weaker components which can chip and crack during the trimming and forming of the leadframe. In addition, this can result an increased chance of inadvertently exposing the semiconductor component to the environment.

Accordingly, what is needed is packaging for an integrated circuit device which does not experience significant bow during the forming process. What is also needed is a package for an integrated circuit device which can be easily incorporated into current manufacturing processes without damage to the packaging.

SUMMARY OF THE INVENTION

An integrated circuit device includes a semiconductor component coupled with a lead frame, and an integrated circuit package encompassing at least a portion of the semiconductor component. The integrated circuit package has a first surface and a second surface, and side surfaces, where the first surface is opposite the second surface. The integrated circuit has a parting line disposed on the side surfaces, where the parting line is offset toward a second surface of the integrated circuit package. The parting line and the first surface define a first portion of the integrated circuit package, where the first portion has a first volume of material. The parting line and the second surface define a second portion of the integrated circuit package, the second portion having a second volume of material, where the first volume is substantially the same as the second volume.

Other options for the integrated circuit device include as follows. For instance, the first surface of the integrated circuit package includes at least one recessed area. Alternatively, the first surface includes two or more recessed areas, and each recessed area is substantially identical to each other. In another option, at least one recessed area has a rectangular shape, and optionally the rectangular shape is defined in part by four corner portions, and at least one of the corner portions is curved. The recessed area, in one embodiment, extends fully from a first side surface of the integrated circuit package to a second side surface of the integrated circuit package. In another embodiment, each recessed area extends partially from a first side surface of the integrated circuit package to a second side surface of the integrated circuit package, and a border of integrated circuit package material extends around a perimeter edge of the first surface.

In another embodiment, an integrated circuit device includes a semiconductor component coupled with a lead frame, and an integrated circuit package encompassing at least a portion of the semiconductor component. The integrated circuit package has a first surface and a second surface, and side surfaces, where the first surface is opposite the second surface. The integrated circuit has a parting line disposed on the side surfaces, where the parting line is offset toward a second surface of the integrated circuit package. The first surface comprises a non-planar surface and the second surface is a uniform planar surface.

In one option, the parting line and the first surface define a first portion of the integrated circuit package, where the first portion has a first volume of material. The parting line and the second surface define a second portion of the integrated circuit package, the second portion having a second volume of material, where the first volume is substantially the same as the second volume. For instance, the first surface of the integrated circuit package includes at least one recessed area. Alternatively, the first surface includes two or more recessed areas, and each recessed area is substantially identical to each other. In another option, at least one recessed area has a rectangular shape. The recessed area, in one embodiment, extends fully from a first side surface of the integrated circuit package to a second side surface of the integrated circuit package. In another embodiment, each recessed area extends partially from a first side surface of the integrated circuit package to a second side surface of the integrated circuit package, and a border of package material extends around a perimeter edge of the first surface. In yet another embodiment, the lead frame has an alignment portion, and the alignment portion has at least one alignment cut out therein.

In yet another embodiment, an integrated circuit device includes a semiconductor component coupled with a lead frame, and an integrated circuit package encompassing at least a portion of the semiconductor component. The integrated circuit package has a first surface and a second surface, and side surfaces, where the first surface is opposite the second surface. The integrated circuit has a parting line disposed on the side surfaces, where the parting line is offset toward a second surface of the integrated circuit package. The first surface has two or more recessed areas, where optionally each recessed area is substantially identical.

In another embodiment, an integrated circuit device includes a semiconductor component coupled with a lead frame, and an integrated circuit package encompassing at least a portion of the semiconductor component. The integrated circuit package has a first surface and a second surface, and side surfaces, where the first surface is opposite the second surface. The integrated circuit has a parting line disposed on the side surfaces, where the parting line is offset toward a second surface of the integrated circuit package. The first surface having at least one recessed area, wherein the at least one recessed area is at least partially surrounded by a perimeter edge of material. Optionally, the perimeter edge has a width of about 0.75 mm, or alternatively a width of about 1.5 mm.

Alternatively, in another embodiment, an integrated circuit device includes a semiconductor component coupled with a lead frame, and an integrated circuit package encompassing at least a portion of the semiconductor component. The semiconductor component, and optionally the area adjacent thereto, define a die area having a first thickness. The integrated circuit package has a first surface and a second surface, and side surfaces, where the first surface is opposite the second surface. The integrated circuit has a parting line disposed on the side surfaces, where the parting line is offset toward a second surface of the integrated circuit package. At least a first area is defined by the first surface without the die area, and the first area has a second thickness, where the second thickness is less than the first thickness. Optionally, the first area completely surrounds the die area.

In one embodiment, an integrated circuit device includes a semiconductor component coupled with a lead frame, and an integrated circuit package encompassing at least a portion of the semiconductor component. A surface of the semiconductor component, and optionally a surface of the area adjacent thereto, define a die area surface. The integrated circuit package has a first surface and a second surface, and side surfaces, where the first surface is opposite the second surface. The integrated circuit has a parting line disposed on the side surfaces, where the parting line is offset toward a second surface of the integrated circuit package. A first area is defined by the first surface without the die area, the first area having a first area surface, where the first area surface is recessed away from the die area surface. Alternatively, at least a first area and a second area are defined by the first surface without the die area, and the die area disposed between the first area and the second area. The first area and the second area each extend from the first side surface to the second side surface. Furthermore, the first area has a first area surface, the second area having a second area surface, and the first area surface and the second area surface are recessed away from the die area surface.

In yet another embodiment, an integrated circuit device includes a semiconductor component coupled with at least one conductor, and an integrated circuit package encompassing at least a portion of the semiconductor component. The integrated circuit package has a first surface and a second surface, and side surfaces, where the first surface is opposite the second surface. The integrated circuit has a parting line disposed on the side surfaces, where the parting line is offset toward a second surface of the integrated circuit package. The parting line and the first surface define a first portion of the integrated circuit package, where the first portion has a first volume of material. The parting line and the second surface define a second portion of the integrated circuit package, the second portion having a second volume of material, where the first volume is substantially the same as the second volume. The first surface of the integrated circuit package includes at least one recessed area, and comprises a non-planar surface. The second surface is a uniform planar surface. Alternatively, the first surface includes two or more recessed areas. The recessed area, in one embodiment, extends fully from a first side surface of the integrated circuit package to a second side surface of the integrated circuit package. In another embodiment, the first surface comprises a bottom surface of the integrated circuit package. In yet another embodiment, the device includes two or more semiconductor components.

A method is also provided herein which includes coupling a semiconductor device to a leadframe, overmolding a package on at least a portion of the semiconductor device and over a portion of the leadframe and forming a parting line, where the package has a first surface and a second surface, and side surfaces, and the parting line is offset toward a second surface of the package. The method further includes forming at least one recess in the first surface of the package. Alternatively, forming at least one recess in the first surface of the package occurs while the package is overmolded. In yet another option, the method further includes trimming the leadframe and forming leads of the leadframe. Yet another alternative includes forming an alignment portion on the leadframe.

The integrated circuit package reduces bow when the parting line is offset from the center of a side surface. A further benefit is that the support is maintained on the perimeter of the package, and the package is sturdy enough to withstand the rigor of the trim and form machine. A cost savings is enjoyed also since less material is used to make the package. In addition, the package is aesthetically pleasing to the customer.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims and their equivalents.

DESCRIPTION OF THE EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural changes may be made without departing from the scope of the present invention. Therefore, the following detailed description is not to be taken in a limiting sense, and the scope of the present invention is defined by the appended claims and their equivalents.

Figure 1A:
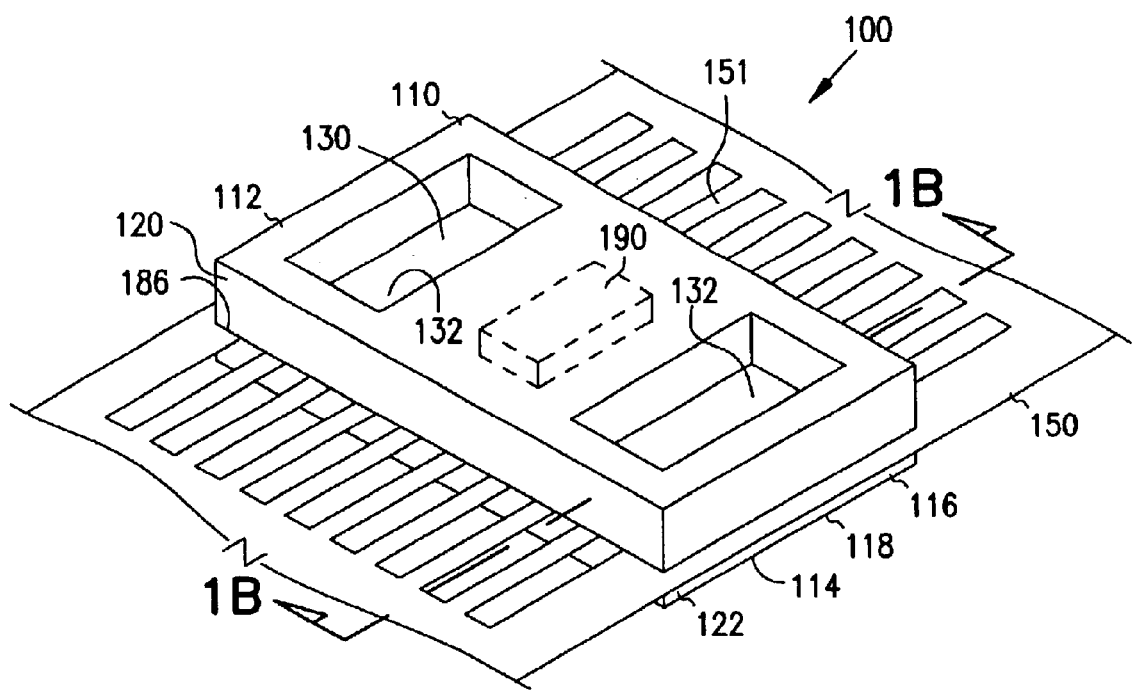
FIG. 1A is a perspective view illustrating an integrated circuit device constructed in accordance with one embodiment.
Figure 1B:
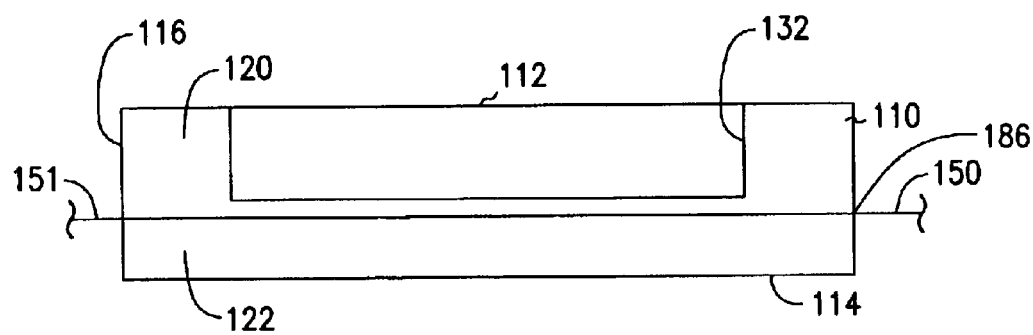
FIG. 1B is a schematic cross-sectional view illustrating the integrated circuit device shown in FIG. 1A taken along 1B—1B.

FIG. 1 illustrates a perspective view of an integrated circuit device 100 constructed in accordance with one embodiment. The integrated circuit device 100 generally includes an integrated circuit package 110, a lead frame 150 including at least one conductor 151, and at least one semiconductor component 190. Optionally, the lead frame 150 is included in a strip of several lead frames coupled together. The lead frame 150 is shown prior to the trimming and forming process. The integrated circuit package 110 includes a first surface 112, a second surface 114, and side surfaces 116. The first surface 112 is opposite the second surface 114, and optionally the first surface 112 comprises a bottom surface 118 of the integrated circuit package 110. In one embodiment, the first surface 112 comprises a non-planar surface, and the second surface 114 comprises a uniform planar surface, i.e. a substantially flat surface. The integrated circuit package 110 is formed, for example by overmolding the leadframe 150 and semiconductor component 190, and resulting in a parting line 186 formed on the integrated circuit package 110. Optionally, the parting line 186 is disposed substantially adjacent to the leadframe 150. The parting line 186 is disposed on the side surfaces 116 of the integrated circuit package 110, and is offset toward the second surface 114 of the integrated circuit package 110.

The integrated circuit package 110 of the integrated circuit device 100 is modified to reduce bow of the integrated circuit package 110 which might otherwise occur during the forming or molding process. In one example, the parting line 186 and the first surface 112 define a first portion 120 of the integrated circuit package, and the first portion 120 has a first volume of material. The parting line 186 and the second surface 114 define a second portion 122 of the integrated circuit package 110, and the second portion 122 has a second volume of material. The first volume, in one embodiment, is substantially the same as the second volume of material. Options for this embodiment includes as follows. For instance, the first surface includes at least one recessed area 130, or may include two or more recessed areas 132. The at least one recessed area 130 optionally has a rectangular shape.

Figure 2A:
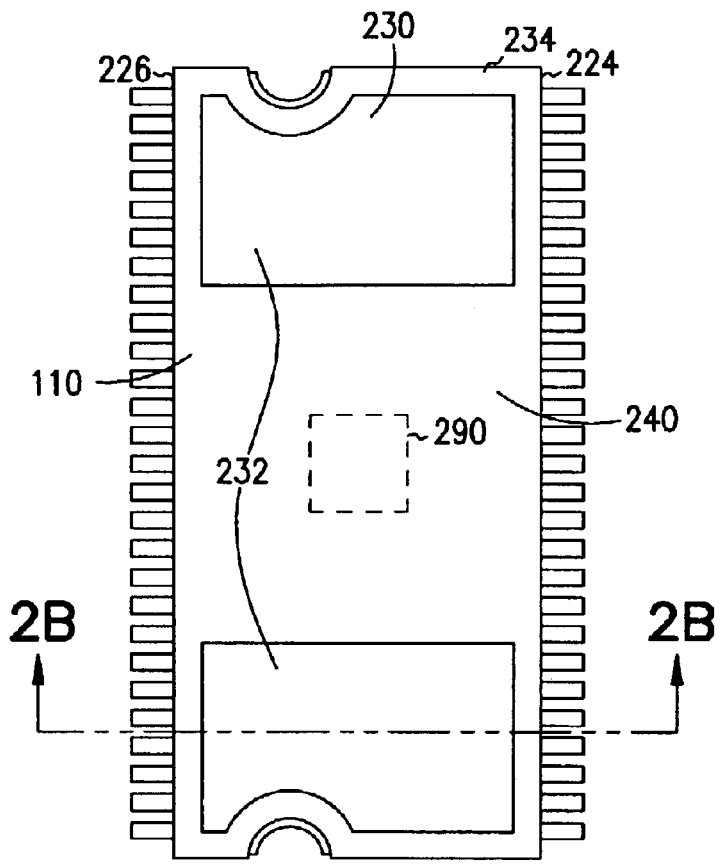
FIG. 2A is a top plan view illustrating an integrated circuit device constructed in accordance with the one embodiment.

Further options for the integrated circuit device 100 include, for example, those shown in FIGS. 2A–8. Referring specifically to FIGS. 2A and 2B, the integrated circuit package 110 includes a die area 240 and leads 282. The leads 282 are formed from the leadframe 150 (FIG. 1), and are disposed toward the first surface 112. However, the leads 282 may also be disposed toward the second surface 114. The die area 240 includes generally the area where the semiconductor component 290 is disposed, and optionally includes the area adjacent to the semiconductor component 290. The die area 240 has a first thickness 241.

The integrated circuit package 110 includes at least one recessed area 230, and optionally includes two or more recessed areas 232. Optionally, each recessed area 230 is substantially identical. The recessed area 230 extends partially from a first side surface 224 to a second side surface 226. The recessed area 230 has a second thickness 243, where the second thickness 243 is smaller than the first thickness 241.

Figure 2B:
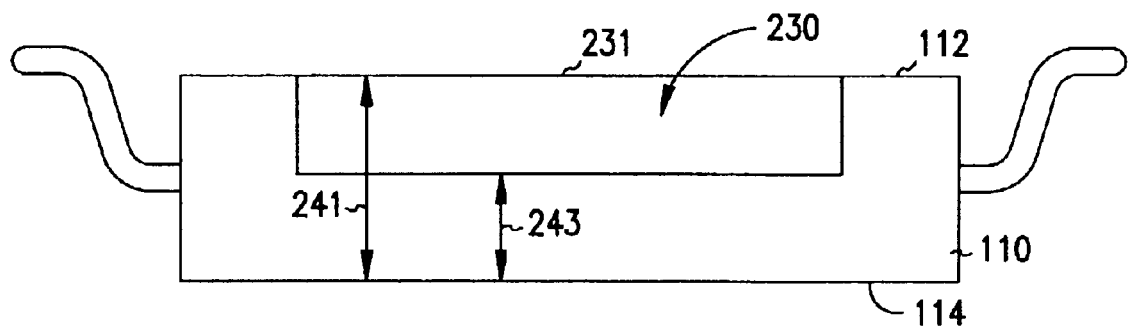
FIG. 2B is cross-sectional view illustrating the integrated circuit device shown in FIG. 2A taken along 2B—2B.

The recessed area 230 includes a perimeter 234 of package material, which assists in stabilizing the integrated circuit device 100 (FIG. 1) after it has been attached to a circuit board. As shown in FIG. 2B, the perimeter 234 of package material extends up from the recessed area 230 and has the same height as the die area surface 231. In one embodiment, the perimeter 234 has a width of about 0.75 mm along at least a portion of the perimeter 234. In another embodiment, the perimeter 234 has a width of about 1.5 mm along at least a portion of the perimeter 234.

Figure 3:
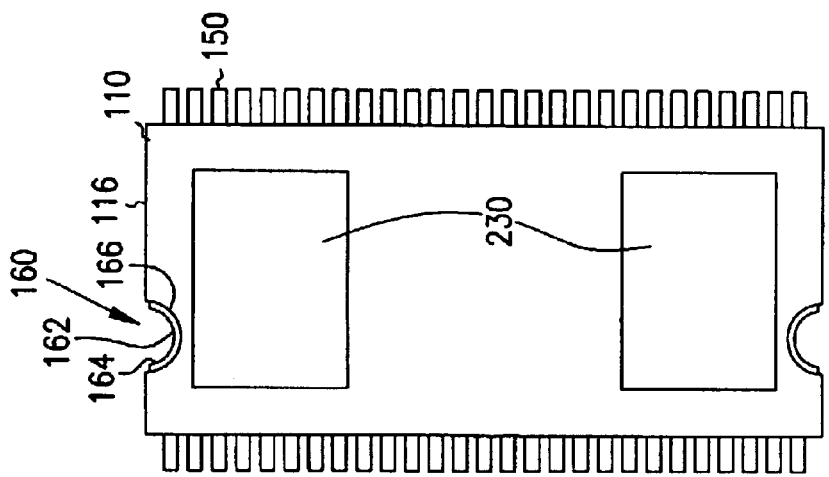
FIG. 3 is a top plan view illustrating an integrated circuit device constructed in accordance with the one embodiment.

Referring to FIG. 3, the integrated circuit package 110 includes two or more recessed areas 230. Yet another option for any of the above and below discussed integrated circuit packages 110 includes the leadframe 150 having an alignment portion 160, and the alignment portion 160 has at least one alignment cut out 162 therein. For example, the alignment cut out 162 comprises a semi-circular cut out 164 formed in a side surface of the leadframe 150. Optionally, a package alignment cut out 166 is disposed in the integrated circuit package 110, for example in the side surface 116 of the integrated circuit package 110.

Figure 4:
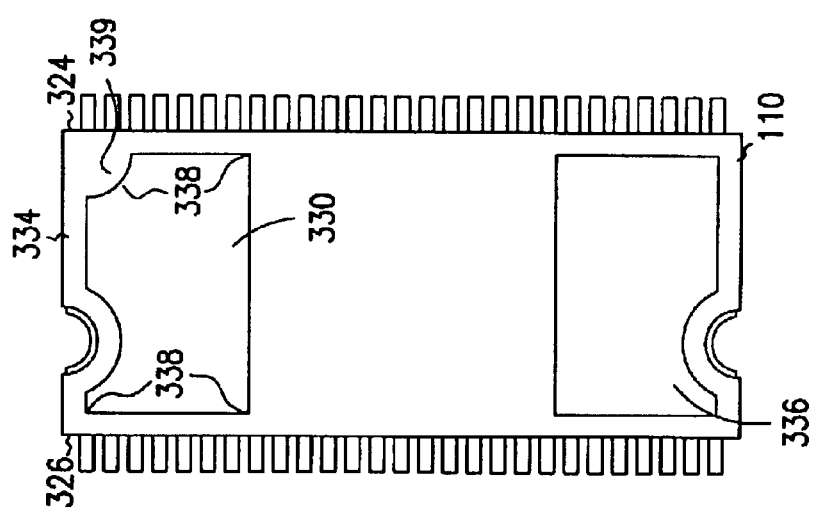
FIG. 4 is a top plan view illustrating an integrated circuit device constructed in accordance with the one embodiment.

Referring to FIG. 4, the integrated circuit package 110 includes at least one recessed area 330. The recessed area 330 extends partially from a first side surface 324 of the integrated circuit package 110 to a second side surface 326 of the integrated circuit package 110. The recessed area 330 includes a perimeter 334 of package material, and has a generally rectangular shape 336. The rectangular shape 336 has four corner portions 338, where at least one 339 of the corner portions 338 is curved, which can assist in orienting the integrated circuit package 110.

Figure 5:
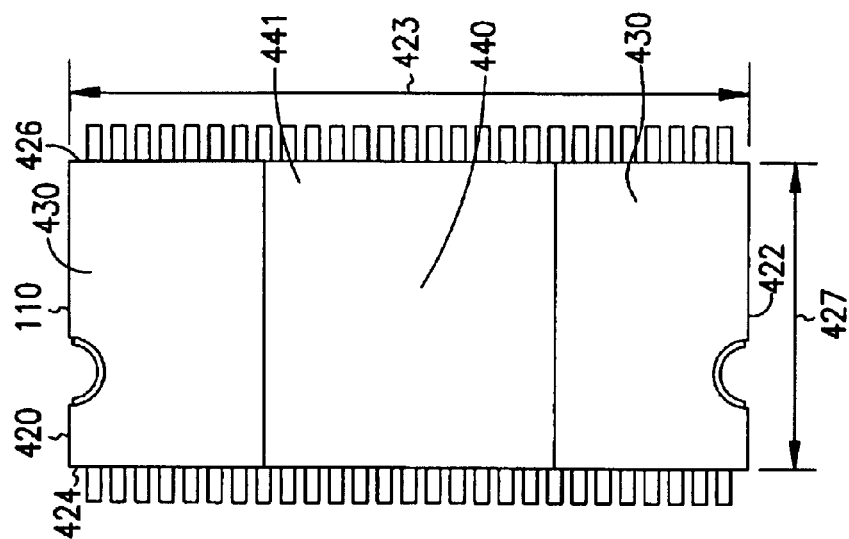
FIG. 5 is a top plan view illustrating an integrated circuit device constructed in accordance with the one embodiment.
Figure 6A:
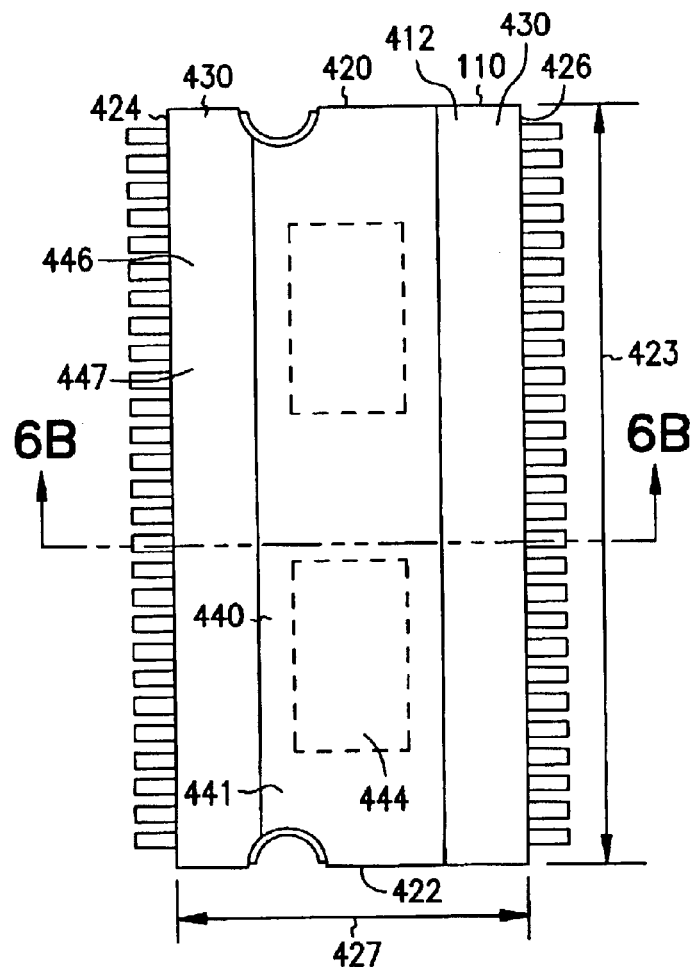
FIG. 6A is a top plan view illustrating an integrated circuit device constructed in accordance with the one embodiment.
Figure 6B:
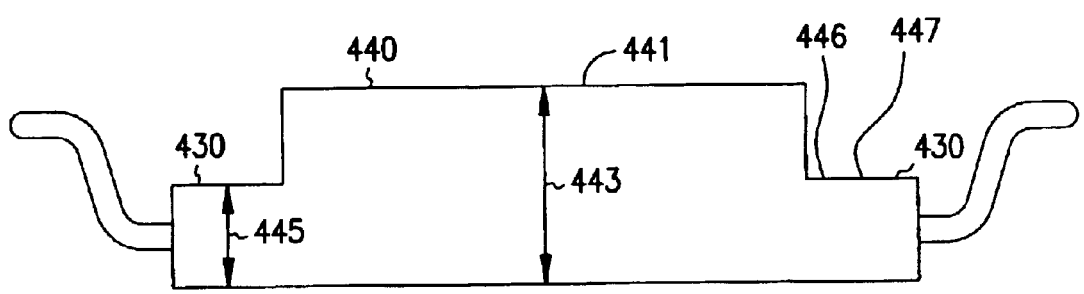
FIG. 6B is cross-sectional view illustrating the integrated circuit device shown in FIG. 6A taken along 6B—6B.

FIGS. 5, 6A, and 6B illustrate another embodiment of the integrated circuit package 110, which includes at least one recessed area 430 and a die area 440. The integrated circuit package 110 has a first side surface 420 and a second side surface 422 opposite one another, which define a first length 423 therebetween. The integrated circuit package 110 has a third side surface 424, and a fourth side surface 426 which define a second length 427 therebetween. Each recessed area 430, in one embodiment, extends fully from the third side surface 424 of the integrated circuit package 110 to the fourth side surface 426 of the integrated circuit package 110, where, as shown in FIG. 5, first length 423 is greater than the second length 427. In another option, each recessed area 430, as illustrated in FIG. 6A, extends fully from the first side surface 420 to the second side surface 422, and the first length 423 is greater than the second length 427.

The integrated circuit package 110 includes a die area 440 having a first thickness 443, and the die area 440 having a die area surface 441. The die area 440 comprises generally the portion of the integrated circuit device at which the die or semiconductor components 444 are located. In addition, the die area 440 may include package material adjacent to the die 444. In one embodiment, the integrated circuit device includes two or more semiconductor components 444 in the die area 440. A first area 446 having a first area surface 447 is defined by the first surface 412 without the die area 440, the first area 446 having a second thickness 445. The second thickness 445 is less than the first thickness 443. In another option, the first area surface 447 is recessed away from the die area surface 441, as shown in FIG. 6B, where the first area surface 447 includes one or more recessed areas 430.

Figure 7:
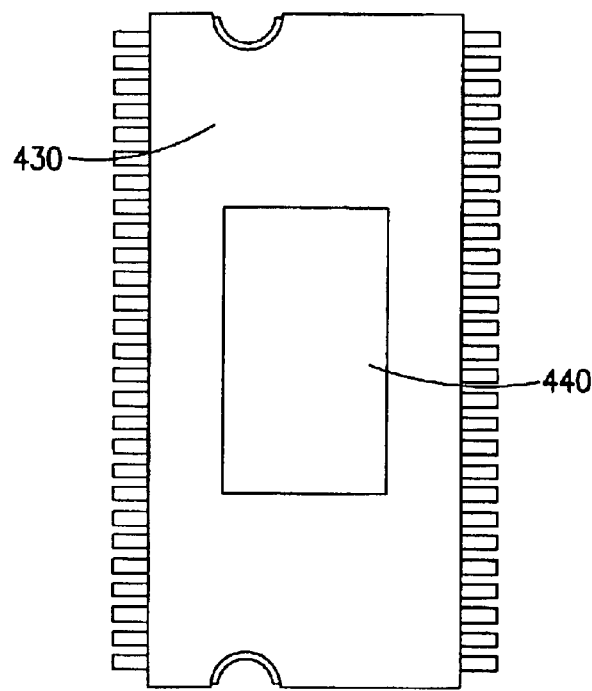
FIG. 7 is a top plan view illustrating an integrated circuit device constructed in accordance with the one embodiment.
Figure 8:
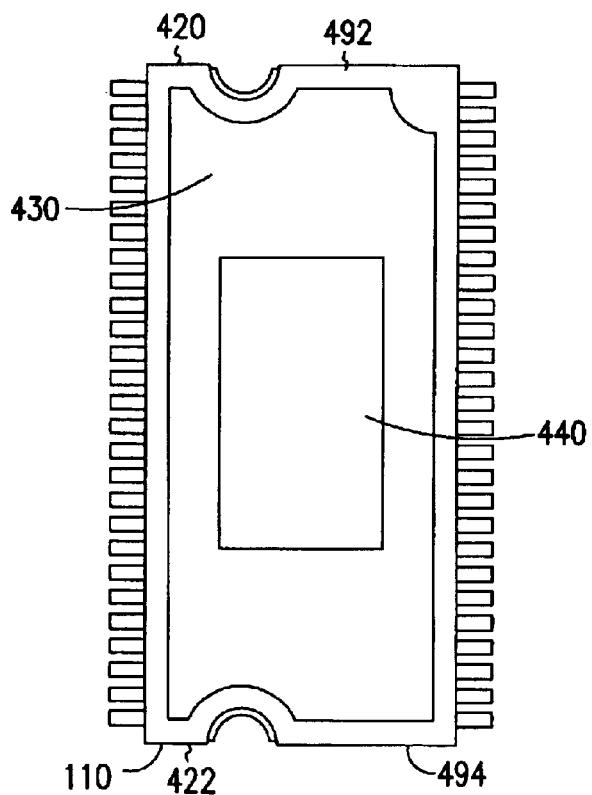
FIG. 8 is a top plan view illustrating an integrated circuit device constructed in accordance with the one embodiment.

Other options shown in FIGS. 5, 6, and 7 include a recessed area 430 which extends fully from a first side surface of the integrated circuit package to a second side surface of the integrated circuit package. In another option, as shown in FIGS. 7 and 8, the recessed area 430 fully surrounds the die area 440 Alternatively, as shown in FIG.

8, the recessed area 430 extends partially from a first side surface 420 of the integrated circuit package 110 to a second side surface 422 of the integrated circuit package 110, and a border 492 of package material extends around a perimeter edge 494 of the first surface.

To form the integrated circuit device, a semiconductor device is coupled to a leadframe. A package is overmolded on at least a portion of the semiconductor device and over a portion of the leadframe. In one option, strips are molded on a bar where inserts are provided, such that the recessed surfaces are formed on the first surface of the integrated circuit package. As the integrated circuit package is overmolded, a parting line is formed. The integrated circuit package has a first surface and a second surface, and side surfaces, and the parting line is offset toward a second surface of the integrated circuit package. During or after the forming process of the integrated circuit package, at least one recess is formed in the first surface of the integrated circuit package. In addition, the lead frame is trimmed and leads are formed. Optionally, an alignment portion is formed on the leadframe.

Advantageously, the integrated circuit package reduces bow when the parting line is offset from the center of a side surface. A further benefit is that the support is maintained on the perimeter of the integrated circuit package, and the integrated circuit package is sturdy enough to withstand the rigor of the trim and form machine, and/or other handling or soldering operations of the integrated circuit package. Furthermore, the above design allows for compliance with overall package height, and also allows for sufficient cooling of the integrated circuit device. A cost savings is enjoyed also since less material is used to make the integrated circuit package. In addition, the integrated circuit package is aesthetically pleasing to the customer, since the recessed portions are disposed toward the circuit board and go unnoticed to the end user.

It is to be understood that the above description is intended to be illustrative, and not restrictive. Many other embodiments will be apparent to those of skill in the art upon reading and understanding the above description. It should be noted that embodiments discussed in different portions of the description or referred to in different drawings can be combined to form additional embodiments of the present invention. The scope of the invention should, therefore, be determined with reference to the appended claims, along with the full scope of equivalents to which such claims are entitled.

What is claimed is:

1. A method comprising:
   coupling a semiconductor device to a leadframe;
   overmolding a package on at least a portion of the semiconductor device and over a portion of the leadframe and forming a parting line, where the package has a first surface and a second surface, and side surfaces, and the parting line is offset toward a second surface of the package; and
   forming at least one recess in the first surface of the package and reducing bow of the package.

2. The method as recited in claim 1, wherein forming at least one recess in the first surface of the package occurs while the package is overmolded.

3. The method as recited in claim 1, further comprising trimming the leadframe and forming leads of the leadframe.

4. The method as recited in claim 1, further comprising forming an alignment portion on the leadframe.

5. The method as recited in claim 1, wherein forming at least one recess includes forming each recess to extend partially from a first side surface of the package to a second side surface of the package, and where the first side surface extends around a perimeter edge of the package.

6. The method as recited in claim 1, wherein forming at least one recess includes forming each recessed area to extend fully from a first side surface of the package to a second side surface of the package.

7. A method comprising:
   coupling a semiconductor device to a leadframe;
   overmolding a package on at least a portion of the semiconductor device and over a portion of the leadframe and forming a parting line, where the package has a first surface and a second surface, and side surfaces, and the parting line is offset toward a second surface of the package; and
   wherein overmolding the package on at least a portion of the semiconductor device and forming the first surface includes forming a non-uniform planar surface and forming the second surface includes forming a uniform planar surface and reducing bow of the package.

8. The method as recited in claim 7, wherein the parting line and the first surface define a first portion of the package, the parting line and the second surface define a second portion of the package, the second portion having a second volume of material, and overmolding the package includes forming the first volume the substantially the same as the second volume.

9. The method as recited in claim 7, wherein the package has a first side surface and a second side surface opposite one another and defining a first length therebetween, and the package has a third side surface and a fourth side surface defining a second length therebetween, and overmolding the package includes forming the first length greater than the second length, and forming the non-uniform planar surface includes forming at least one recessed area to extend fully from the third side surface of the package to the fourth side surface of the package.

10. The method as recited in claim 7, wherein forming the non-uniform planar surface includes forming at least one recessed area in a substantially rectangular shape.

11. A method comprising:
    coupling a semiconductor device to a leadframe;
    overmolding a package on at least a portion of the semiconductor device and over a portion of the leadframe and forming a parting line, where the package has a first outer surface and a second outer surface, and side surfaces, and the parting line is offset toward second outer surface of the package;
    wherein the parting line and the first surface define a first portion of the package, the first portion having a first volume of material, the parting line and the second outer surface define a second portion of the package, the second portion having a second volume of material, and overmolding the package includes forming the first volume substantially the same as the second volume; and
    forming at least one recess in the first outer surface of the package.

12. A method comprising:
    coupling a semiconductor device to a leadframe;
    overmolding a package on at least a portion of the semiconductor device and over a portion of the leadframe and forming a parting line, where the package has a first surface and a second outer surface, and side surfaces, and the parting line is offset toward the second surface of the package;

wherein the parting line and the first surface define a first portion of the package, the first portion having a first volume of material, the parting line and the second surface define a second portion of the package, the second portion having a second volume of material, and overmolding the package includes forming the first volume substantially the same as the second volume; and forming at least one recessed area in the first surface of the package, and each recessed area extends partially from a first side surface of the package to a second side surface of the package.

13. A method comprising:

coupling a semiconductor device to a leadframe;

overmolding a package on at least a portion of the semiconductor device and over a portion of the leadframe and forming a parting line, where the package has a first surface and a second outer surface, and side surfaces, and the parting line is offset toward the second surface of the package;

wherein the parting line and the first surface define a first portion of the package, the first portion having a first volume of material, the parting line and the second surface define a second portion of the package, the second portion having a second volume of material, and overmolding the package includes forming the first volume substantially the same as the second volume; and forming at least one recessed area includes forming each recessed area with a border of material.

14. A method comprising:

coupling a semiconductor device to a leadframe;

overmolding a package on at least a portion of the semiconductor device and over a portion of the leadframe and forming a parting line, where the package has a first surface and a second surface, and side surfaces, and the parting line is formed along the side surfaces and the parting line is offset toward a second surface of the package;

forming a die area having a die area surface, wherein the first surface includes the die area surface, and the semiconductor device and at least one portion adjacent to the semiconductor device define the die area;

recessing at least a first area defined by the first surface without the die area surface, wherein recessing the first area includes recessing the first area away from the die area surface; and reducing bow of the package.

15. The method as recited in claim 14, wherein forming at least one recessed area includes forming two or more recessed areas.

16. The method as recited in claim 15, wherein forming the two or more recessed areas include forming the recessed areas substantially identical to one another.

17. A method comprising:

coupling a semiconductor device to a leadframe;

overmolding a package on at least a portion of the semiconductor device and over a portion of the leadframe and forming a parting line, where the package has a first surface and a second surface, and side surfaces, and the parting line is formed along the side surfaces and the parting line is offset toward a second surface of the package;

forming a die area having a die area surface, where the semiconductor device and at least one portion adjacent to the semiconductor device define the die area;

recessing at least a first area defined by the first surface without the die area, wherein recessing the first area includes recessing the first area away from the die area surface; and wherein the package has a first side surface and a second side surface opposite one another and defining a first length therebetween, and the package has a third side surface and a fourth side surface defining a second length therebetween, and overmolding the package includes forming the first length greater than the second length, and forming each recessed area to extend fully from the third side surface of the package to the fourth side surface of the package.

18. A method comprising:

coupling a semiconductor device to a leadframe;

overmolding a package on at least a portion of the semiconductor device and over a portion of the leadframe and forming a parting line, where the package has a first surface and a second surface, and side surfaces, and the parting line is formed along the side surfaces and the parting line is offset toward a second surface of the package;

forming a die area having a die area surface, where the semiconductor device and at least one portion adjacent to the semiconductor device define the die area;

recessing at least a first area defined by the first surface without the die area, wherein recessing the first area includes recessing the first area away from the die area surface; and wherein the package has a first side surface and a second side surface opposite one another and defining a first length therebetween, and the package has a third side surface and a fourth side surface defining a second length therebetween, and overmolding the package includes forming the first length greater than the second length, and forming each recessed area to extend filly from the first side surface of the package to the second side surface of the package.

19. A method comprising:

coupling at least one semiconductor device to a leadframe;

overmolding a package on at least a portion of the at least one semiconductor device and over a portion of the leadframe and forming a parting line, where the package has a first surface and a second surface, and side surfaces, and the parting line is offset toward a second surface of the package;

wherein the parting line and the first surface define a first portion of the package, the first portion having a first volume of material, the parting line and the second surface define a second portion of the package, the second portion having a second volume of material, and overmolding the package includes forming the first volume the substantially the same as the second volume; and forming at least one recess in the first surface of the package.

20. The method as recited in claim 19, wherein forming at least one recessed area includes forming two or more recessed areas substantially identical to one another.

21. The method as recited in claim 19, wherein forming at least one recessed area includes forming a recessed are to extend fully from a first side surface of the package to a second side surface of the package.

* * * * *

UNITED STATES PATENT AND TRADEMARK OFFICE
CERTIFICATE OF CORRECTION

PATENT NO. : 6,887,740 B2  
DATED : May 3, 2005  
INVENTOR(S) : Tandy et al.

It is certified that error appears in the above-identified patent and that said Letters Patent is hereby corrected as shown below:

Column 10,  
Line 37, delete "filly" and insert -- fully --, therefor.

Signed and Sealed this

Twelfth Day of July, 2005

JON W. DUDAS  
*Director of the United States Patent and Trademark Office*